United States Patent
Horiguchi et al.

(10) Patent No.: US 8,432,510 B2
(45) Date of Patent: Apr. 30, 2013

(54) LIQUID CRYSTAL DISPLAY DEVICE AND LIGHT DETECTOR HAVING FIRST AND SECOND TFT AMBIENT LIGHT PHOTO-SENSORS ALTERNATIVELY ARRANGED ON THE SAME ROW

(75) Inventors: Masahiro Horiguchi, Tottori (JP); Takashi Kunimori, Tottori (JP)

(73) Assignee: Sony Corporation, Tokyo (JP)

(*) Notice: Subject to any disclaimer, the term of this patent is extended or adjusted under 35 U.S.C. 154(b) by 504 days.

(21) Appl. No.: 12/237,135

(22) Filed: Sep. 24, 2008

(65) Prior Publication Data
US 2009/0086137 A1 Apr. 2, 2009

(30) Foreign Application Priority Data
Oct. 1, 2007 (JP) ................................. 2007-257178

(51) Int. Cl.
*G02F 1/1335* (2006.01)
*G02F 1/136* (2006.01)
*G09G 3/36* (2006.01)
*G09G 5/00* (2006.01)
*G06F 3/042* (2006.01)
*G06F 3/038* (2006.01)

(52) U.S. Cl.
USPC ............... 349/61; 349/43; 345/175; 345/102; 345/207

(58) Field of Classification Search .................... 349/12; 345/175
See application file for complete search history.

(56) References Cited

U.S. PATENT DOCUMENTS
2002/0158997 A1* 10/2002 Fukami et al. ................. 349/49
2007/0188441 A1* 8/2007 Tanaka et al. ................. 345/102

FOREIGN PATENT DOCUMENTS
| JP | A-2002-131719 | 5/2002 |
| JP | A-2003-215534 | 7/2003 |
| JP | A-2004-007237 | 1/2004 |
| JP | A-2005-121997 | 5/2005 |
| JP | A-2007-094097 | 4/2007 |
| JP | A-2007-163628 | 6/2007 |

\* cited by examiner

*Primary Examiner* — Edward Glick
*Assistant Examiner* — Dennis Y Kim
(74) *Attorney, Agent, or Firm* — K&L Gates LLP

(57) ABSTRACT

Provided is a liquid crystal display device including: a liquid crystal display panel; a light detector which is mounted on the liquid crystal display panel and has a plurality of TFT ambient light photo-sensors composed of thin-film transistors (TFTs) for detecting external light; an illumination unit which illuminates light on the liquid crystal display panel; a detection circuit connected to the light detector; and a control unit which controls the brightness of the illumination unit on the basis of the output of the detection circuit, wherein the plurality of TFT ambient light photo-sensors include first and second TFT ambient light photo-sensors for detecting lights of different systems, and, among source wires or drain wires of the first TFT ambient light photo-sensors and the second TFT ambient light photo-sensors, wires which are not connected to the detection circuit are formed by a single wire.

7 Claims, 13 Drawing Sheets

LIQUID CRYSTAL DISPLAY DEVICE AND LIGHT DETECTOR HAVING FIRST AND SECOND TFT AMBIENT LIGHT PHOTO-SENSORS ALTERNATIVELY ARRANGED ON THE SAME ROW

This application claims the benefit of Japanese Application No. 2007-257178 filed in Japan on Oct. 1, 2007. The disclosure of the prior application is hereby incorporated by reference herein in its entirety.

BACKGROUND

1. Technical Field

The present invention relates to a liquid crystal display device and an electronic apparatus having a backlight unit, and more particularly, a liquid crystal display device and an electronic apparatus, which are capable of reducing the number of various wires associated with a light detector and reducing a wire space, when the light detector for detecting light in a liquid crystal display panel is formed and the brightness of an illumination unit is automatically controlled according to the intensity of the environment light detected by the light detector.

2. Related Art

Recently, a liquid crystal display device has been rapidly applied to an information communication apparatus and a general electric apparatus. Since a liquid crystal display panel itself does not emit light, a transmissive type liquid crystal display device including a backlight unit as an illumination unit is widely used, but, in a portable device, a reflective type liquid crystal display device which does not require a backlight unit is widely used in order to reduce power consumption. However, in the reflective type liquid crystal display device, since environment light is used as an illumination unit, an image is unlikely to be viewed where environment light is suppressed or non-existent. Accordingly, a reflective type liquid crystal display device using a front light unit as an illumination unit or a semi-transmissive-type liquid crystal display device using a transmissive property and a reflective property has been developed.

The reflective liquid crystal display device using the front light unit as the illumination unit can display an image by lighting the front light unit at a dark place and display an image using environment light without lighting the front light unit at a bright place. The semi-transmissive-type liquid crystal display device can display an image using a transmission portion of a pixel area by lighting a backlight unit as the illumination unit at a dark place and display an image using environment in a reflection portion without lighting the backlight unit at a bright place. Accordingly, in the reflective type or semi-transmissive type liquid crystal display device, since the illumination unit, such as the front light unit or the backlight unit, does not need to be always lighted, it is possible to significantly reduce power consumption.

In addition, the transmissive type liquid crystal display device may be an image that can be clearly viewed although the brightness of the backlight unit is decreased at the dark place, but is likely to be viewed when the brightness of the backlight unit is low at the bright place.

As described above, various types of liquid crystal display devices are different from one another in visibility of a liquid crystal display screen by the intensity of environment light. Accordingly, a method of providing a light detector in a liquid crystal display device, detecting the brightness of environment light by the output of the light detector, and controlling the brightness of an illumination unit is known (see JP-A-2002-131719 (claims, paragraphs [0010] to [0013], and FIG. 1), JP-A-2003-215534 (claims, paragraphs [0007] to [0019], FIGS. 1 to 3) and JP-A-2004-007237 (claims, paragraphs [0023] to [0028], FIG. 1).

For example, JP-A-2002-131719 discloses a liquid crystal display device in which a thin-film transistor (TFT) for detecting light is formed on a substrate of a liquid crystal display panel as a light detector and a backlight is automatically turned on/off according to the brightness of surrounding environment light using TFT ambient light photo-sensors for detecting light leakage current of the TFT. JP-A-2003-215534 discloses a liquid crystal display device which uses a photodiode as a light detector and supplies current undergone temperature compensation to a light-emitting diode as a backlight unit according to the brightness of surrounding environment light. JP-A-2004-007237 discloses a portable terminal in which a backlight unit or a light-emitting diode used as an operation display unit of an apparatus is used as a light detector and lighting of the backlight unit is controlled on the basis of an electromotive force of the light-emitting diode according to the brightness of surrounding environment light.

Meanwhile, in the case where the brightness of the illumination unit is controlled by the intensity of environment light as described above, for example, when the light may be temporarily shielded by a hand, it is determined that the environment light weakens by mistake and thus malfunctions may be performed. JP-A-2005-121997 (claims, paragraphs [0036] to [0047], and FIGS. 4 and 5) discloses a backlight illumination method of a liquid crystal display device, in which a plurality of light detectors are provided in the liquid crystal display device and a backlight unit illuminates light only when the outputs of the plurality of light detectors are equally changed. JP-A-2007-094097 (claims, paragraphs [0019] to [0021] and [0029] to [0032], and FIGS. 2 and 3) discloses a liquid crystal display device in which a plurality of light detectors are provided and a backlight unit illuminates light only when majority of the light detectors are changed.

In the inventions disclosed in JP-A-2005-121997 and JP-A-2007-094097, analog output type detectors such as photodiodes or phototransistors are used as the plurality of light detectors, the outputs of the plurality of light detectors are operated, and the backlight unit illuminates light on the basis of the operation result. If the outputs of the analog output type light detectors, output voltage values or output current values are directly related to the intensity of environment light, it is possible to easily determine whether or not the intensity of environment light is equal to or larger than a predetermined value.

In the TFT ambient light photo-sensor employed in JP-A-2002-131719, a time until the output voltage of the TFT ambient light photo-sensor becomes a predetermined voltage value is related to the intensity of environment light. If such a TFT ambient light photo-sensor is used, an original digital operation is necessary for detecting the intensity of environment light. The principle of the TFT ambient light photo-sensor and a general detection circuit will be described with reference to the drawings.

FIG. 13 is a view showing an example of a voltage-current curve of a TFT ambient light photo-sensor. FIG. 14 is a circuit diagram of the TFT ambient light photo-sensor. FIG. 15 is a view showing a capacitor voltage-time curve in the circuit diagram shown in FIG. 14 when brightness is different.

The TFT ambient light photo-sensor has the substantially same configuration as a TFT which is used as a switching element of an active matrix type liquid crystal display panel. Accordingly, it is advantageous that the TFT ambient light photo-sensor can be simultaneously formed when the TFT of the active matrix type liquid crystal display panel is formed. In the TFT ambient light photo-sensor LS, dark current slightly flows in a gate-off area when light is shielded and leakage current is increased according to the intensity (brightness) of light when light reaches a channel portion, as shown in FIG. 13.

As shown in FIG. 14, a constant reverse bias voltage (e.g., −10 V) which becomes the gate-off area is applied to a gate electrode GL of the TFT of the light-receiving portion of the TFT ambient light photo-sensor LS and a capacitor C is connected between a drain electrode $D_L$ and a source electrode $S_L$ in parallel. One end of the capacitor C and the drain electrode $D_L$ are connected to a ground potential. In this state, a constant reference voltage Vs (e.g., +2 V) is applied between the capacitor C by turning on a switching element S1 and then the switching element S1 is turned off, the voltage across the capacitor C is decreased with time according to the brightness of surrounding environment light of the TFT ambient light photo-sensor LS as shown in FIG. 15.

Accordingly, in the TFT ambient light photo-sensor LS, a time until the voltage across the capacitor becomes a predetermined voltage $V_0$ after the switching element S1 is turned off is inversely proportional to the intensity of environment light and the voltage across the capacitor C after the elapse of a predetermined time $t_0$ is inversely proportional to the intensity of environment light. Accordingly, if the time until the voltage across the capacitor becomes the predetermined voltage $V_0$ after the switching element S1 is turned off or the voltage across the capacitor C after the elapse of the predetermined time $t_0$ is measured, the intensity of environment light can be obtained.

In general, the intensity of environment light is converted into an analog output voltage by a sampling hold circuit which is synchronized with the ON/OFF of the switching element S1, the analog output voltage is converted into a digital signal by an A/D converter, and the digital signal is operated such that it is determined whether the intensity of environment light is equal to or larger than the predetermined value or not.

In the inventions disclosed in JP-A-2005-121997 and JP-A-2007-094097, although the plurality of light detectors for detecting environment light are provided, the plurality of light detectors cannot be necessarily used in the same environment and the same condition. For example, if such TFT ambient light photo-sensors are used, a reference voltage value for determining the intensity of environment light is required. The reference voltage value may be previously set, but, actually, the reference voltage is detected by shielding some of the TFT ambient light photo-sensors. Since the spectral sensitivity of the TFT ambient light photo-sensor is not necessarily matched to the visibility of human, some of the TFT ambient light photo-sensors are coated with a color filter layer so as to determine environment light, such that the spectral sensitivity of the TFT ambient light photo-sensor is closer to the visibility of human.

However, if a plurality of TFT ambient light photo-sensors having different systems are used, a plurality of wires are used in each system and thus a wire area forming a wire is increased. If the wire area is increased, the wires of the TFT ambient light photo-sensors are formed in a frame area of the liquid crystal display panel and thus the area of the frame area needs to be proportionally increased. However, in a small-sized liquid crystal display device such as a mobile telephone, since the requirement for a narrow frame of a liquid crystal display panel has been increased, the increase in the size of the frame area is not preferable.

SUMMARY

An advantage of some aspects of claimed subject matter is that it provides a liquid crystal display device which is capable of suppressing the increase in the size of an area in which various types of wires connected to ambient light photo-sensors are formed, although the liquid crystal display device includes a plurality of ambient light photo-sensors having different systems, and an electronic apparatus including the liquid crystal display device.

According to an aspect of one embodiment, there is provided a liquid crystal display device including: a liquid crystal display panel; a light detector which is mounted on the liquid crystal display panel and has a plurality of TFT ambient light photo-sensors composed of thin-film transistors (TFTs) for detecting external light; an illumination unit which illuminates light on the liquid crystal display panel; a detection circuit connected to the light detector; and a control unit which controls the brightness of the illumination unit on the basis of the output of the detection circuit, wherein the plurality of TFT ambient light photo-sensors include first and second TFT ambient light photo-sensors for detecting lights of different systems, and, among source wires or drain wires of the first TFT ambient light photo-sensors and the second TFT ambient light photo-sensors, wires which are not connected to the detection circuit are formed by a single wire.

According to one embodiment, in the light detector for detecting the lights of a plurality of systems, since the wires which are not connected to the detection circuit of the first and second TFT ambient light photo-sensors of different systems are formed by a single routed wire, the routed wires do not need to be provided in every system when detecting the light of the plurality of systems. Accordingly, it is possible to reduce the number of routed wires provided in the light detector and reduce a space for providing the routed wires. Accordingly, it is possible to realize a narrow frame of the liquid crystal display panel and provide a liquid crystal display device suitable for a small-sized electronic apparatus.

The first and second TFT ambient light photo-sensors may be formed of a plurality of ambient light photo-sensors, and the first TFT ambient light photo-sensor and the second TFT ambient light photo-sensor may be adjacently arranged in parallel.

According to one embodiment since the first and second TFT ambient light photo-sensors are adjacently provided, a temperature difference between the both TFT ambient light photo-sensors is reduced and the light can be detected under the same environment. Since the first and second TFT ambient light photo-sensors are adjacently formed, it is possible to form the TFTs having the same characteristics.

Among the source wires or the drain wires of the first and second TFT ambient light photo-sensors arranged in parallel, wires connected to the detection circuit may be routed to the outside of the first and second TFT ambient light photo-sensors arranged in parallel, and the wires which are not connected to the detection circuit may be routed between the first TFT ambient light photo-sensor and the second TFT ambient light photo-sensor.

According to one embodiment, since the first and second TFT ambient light photo-sensors are provided in parallel and the wires which are not connected to the detection circuit are formed between the first and second TFT ambient light photo-sensors, it is possible to realize the unification of the wires which are not connected to the detection circuit by a simplest wire structure.

The first and second TFT ambient light photo-sensors may be formed of a plurality of ambient light photo-sensors, and the first TFT ambient light photo-sensor and the second TFT ambient light photo-sensor may be alternately arranged on the same row.

Among the source wires or the drain wires of the first and second TFT ambient light photo-sensors which are alternately arranged, wires connected to the detection circuit may be routed to one side of the first and second TFT ambient light photo-sensors, and the wires which are not connected to the detection circuit may be routed to the other side of the first and second TFT ambient light photo-sensors.

According to one embodiment, since the plurality of ambient light photo-sensors configuring the first TFT ambient light photo-sensor and the plurality of ambient light photo-sensors configuring the second TFT ambient light photo-sensor are alternately arranged in a line, the first and second TFT ambient light photo-sensors can be arranged in a wide range and false recognition is prevented although environment light is partially blocked by an obstacle. In addition, since the ambient light photo-sensors can be arranged in a line, it is possible to reduce the length corresponding to the width direction of the frame area of the light detector. Thus, it is possible to reduce the width of the side of the liquid crystal display panel in which the first and second TFT ambient light photo-sensors are formed and realize downsizing of the liquid crystal display device.

Among the source wires or the drain wires of the first and second TFT ambient light photo-sensors which are alternately arranged, wires connected to the detection circuit may be composed of first and second wires, the first wire may be routed to one side of the first and second TFT ambient light photo-sensors, the second wire may be routed to the other side of the first and second TFT ambient light photo-sensors, and the wires which are not connected to the detection circuit may be routed in a state of snaking between the ambient light photo-sensors configuring the first and second TFT ambient light photo-sensors.

According to one embodiment, since the wires which are not connected to the detection circuit are routed between the ambient light photo-sensors arranged in a line, it is possible to provide the wires without overlapping the wires which are not connected to the detection circuit and the first and second wires connected to the detection circuit and detect external light (also called environment light) with higher precision.

At least one of the first and second TFT ambient light photo-sensors may be covered with a light-shielding layer or a color filter layer of predetermined colors.

According to one embodiment, for example, if the second TFT ambient light photo-sensor is covered with the light-shielding layer, the output of the second TFT ambient light photo-sensor can be used as a dark reference voltage. Thus, it is possible to realize high-precision control. For example, if the first TFT ambient light photo-sensor is covered with the color filter layer of the predetermined colors, for example, the color filter layer having a spectral sensitivity characteristic close to a luminosity factor of a user, it is possible to realize easier control.

The plurality of TFT ambient light photo-sensors may be simultaneously formed with a TFT formed as a switching element in a process of manufacturing the liquid crystal display panel.

According to one embodiment, since a separate manufacturing process does not need to be added for forming the ambient light photo-sensor, it is possible to simply manufacture the liquid crystal display device with low cost.

According to another aspect of one embodiment, there is provided an electronic apparatus comprising the above-described liquid crystal display device.

According to one embodiment, since the liquid crystal display device capable of reducing a frame area is included, it is possible to provide an electronic apparatus suitable for a small-sized portable terminal.

BRIEF DESCRIPTION OF THE DRAWINGS

One embodiment will be described with reference to the accompanying drawings, wherein like numbers reference like elements.

FIG. 1 is a view showing a capacitor voltage-time curve in the circuit diagram shown in FIG. 14 when brightness is different.

DETAILED DESCRIPTION OF EMBODIMENTS

Exemplary embodiments will be described with reference to the accompanying drawings. However, the following embodiments illustrate a semi-transmissive type liquid crystal display device for embodying the technical idea of the liquid crystal display device and the electronic apparatus claimed, but are not limited to the semi-transmissive type liquid crystal display device and is applicable to other embodiments included in claims, for example, a transmissive type or a reflective type liquid crystal display device.

Embodiment 1

Figure 1:
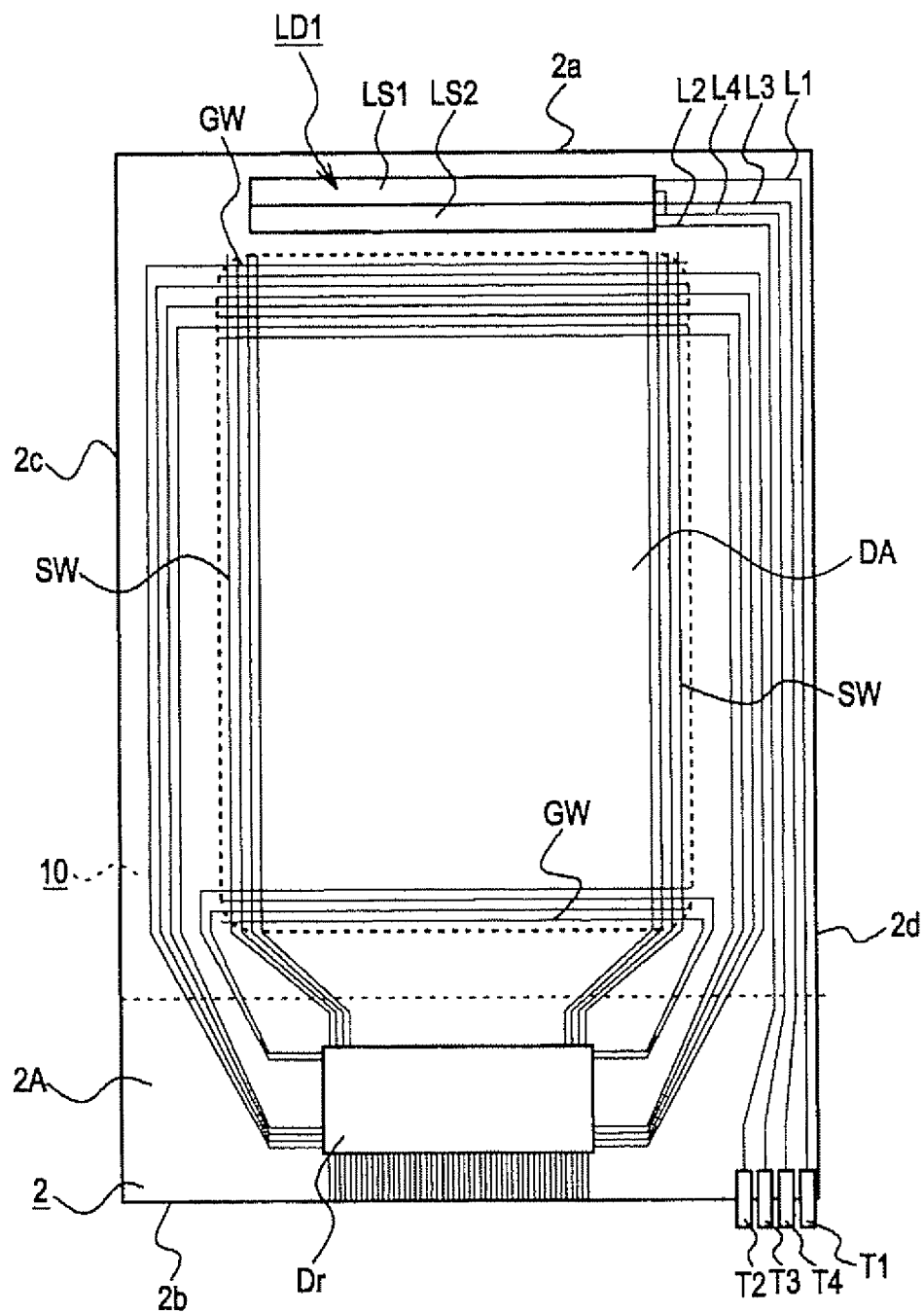
FIG. 1 is a schematic plan view showing an array substrate and perspectively showing a color filter substrate of a semi-transmissive type liquid crystal display device according to Embodiment 1.
Figure 2:
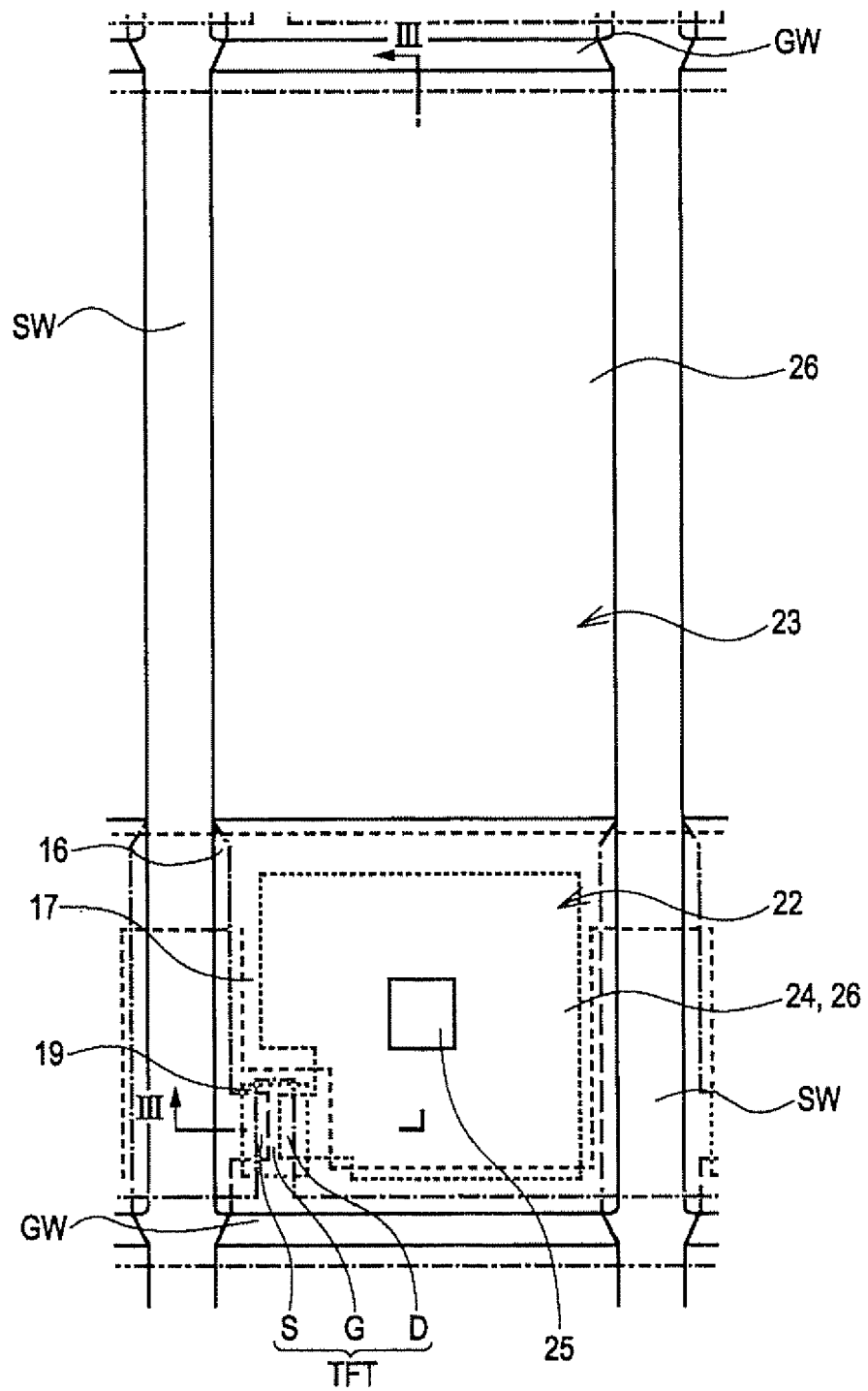
FIG. 2 is a plan view showing one pixel of the array substrate shown in FIG. 1.
Figure 3:
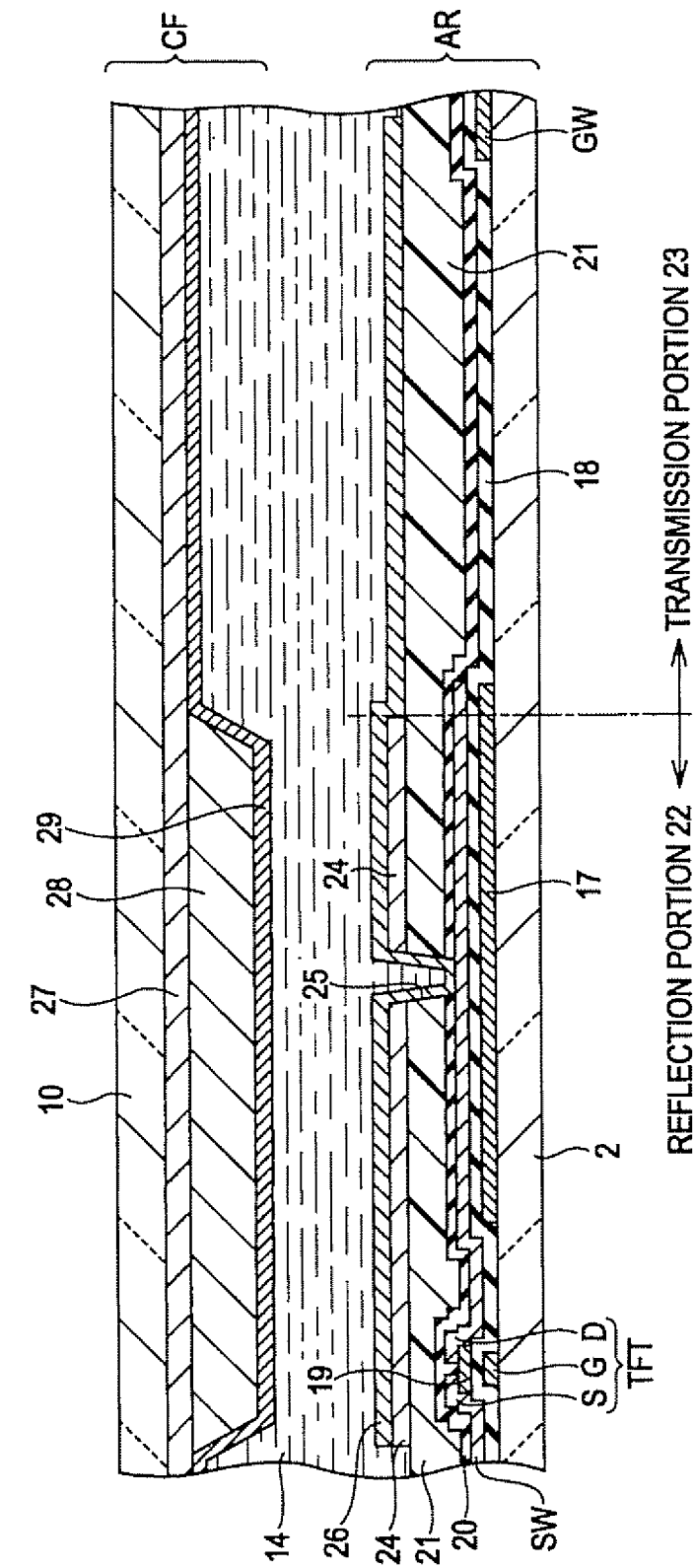
FIG. 3 is a cross-sectional view taken along line III-III of FIG. 2.
Figure 4:
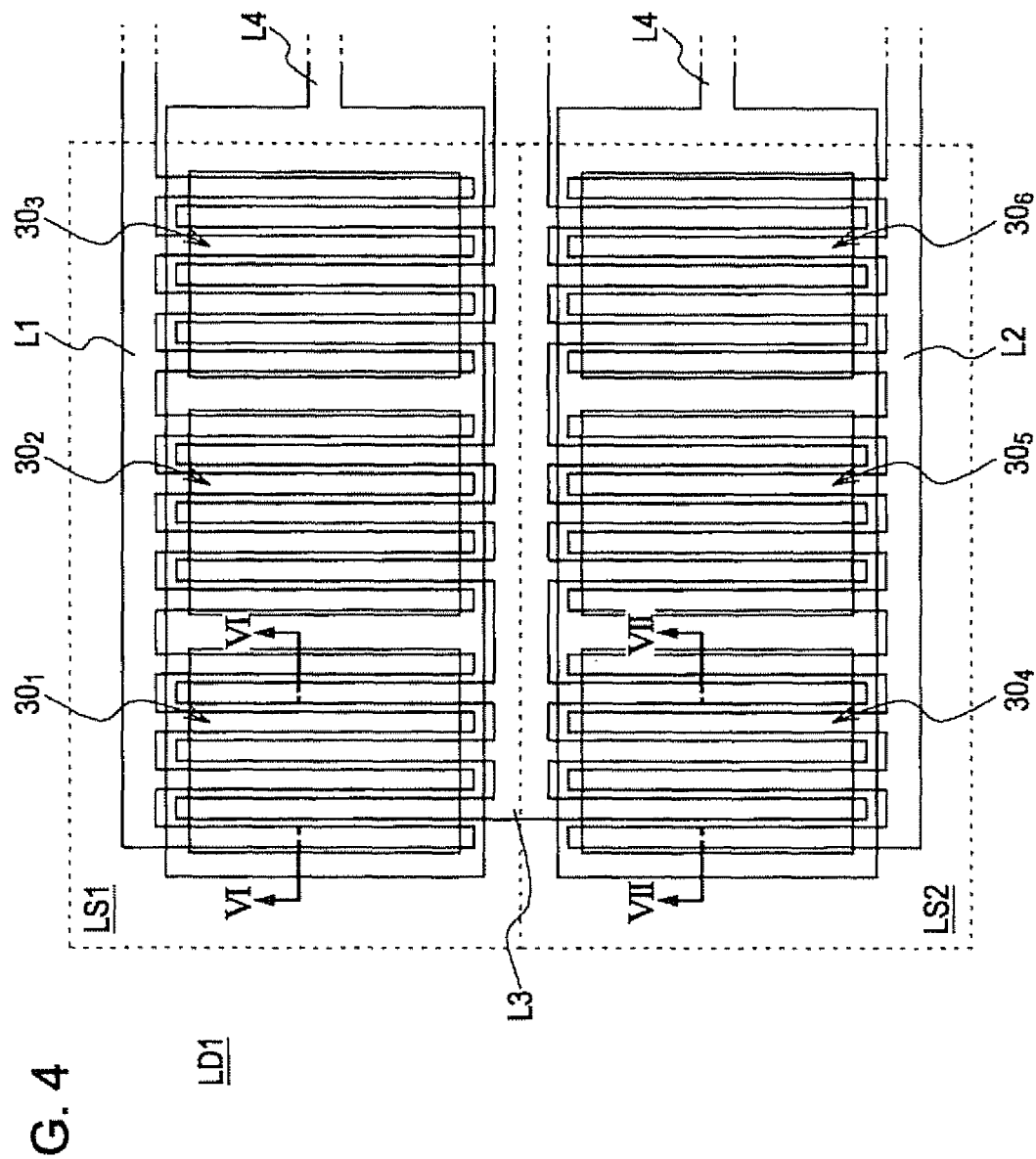
FIG. 4 is an enlarged plan view showing a light detector of Embodiment 1.
Figure 5:
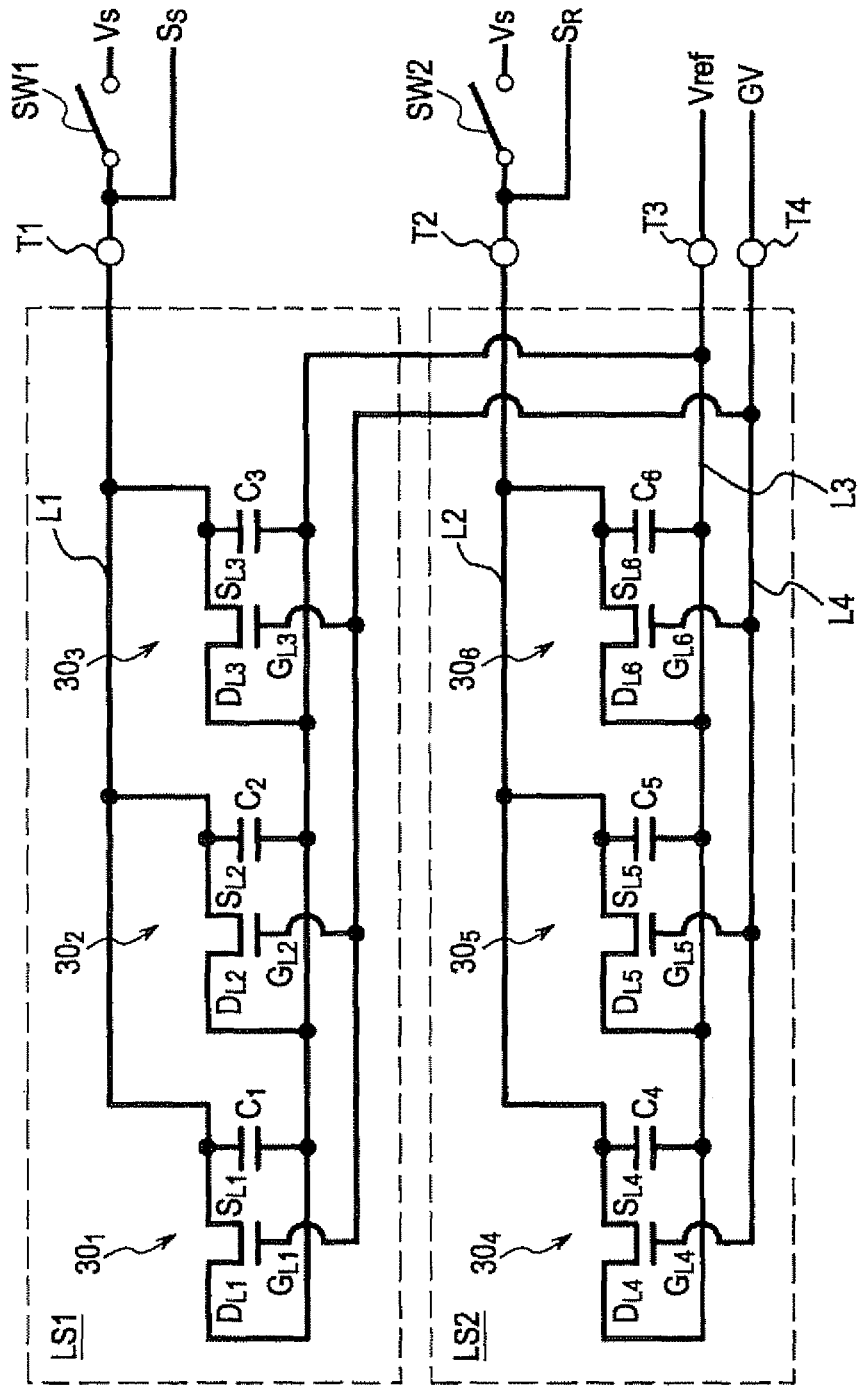
FIG. 5 is an equivalent circuit diagram of the light detector shown in FIG. 4.
Figure 6:
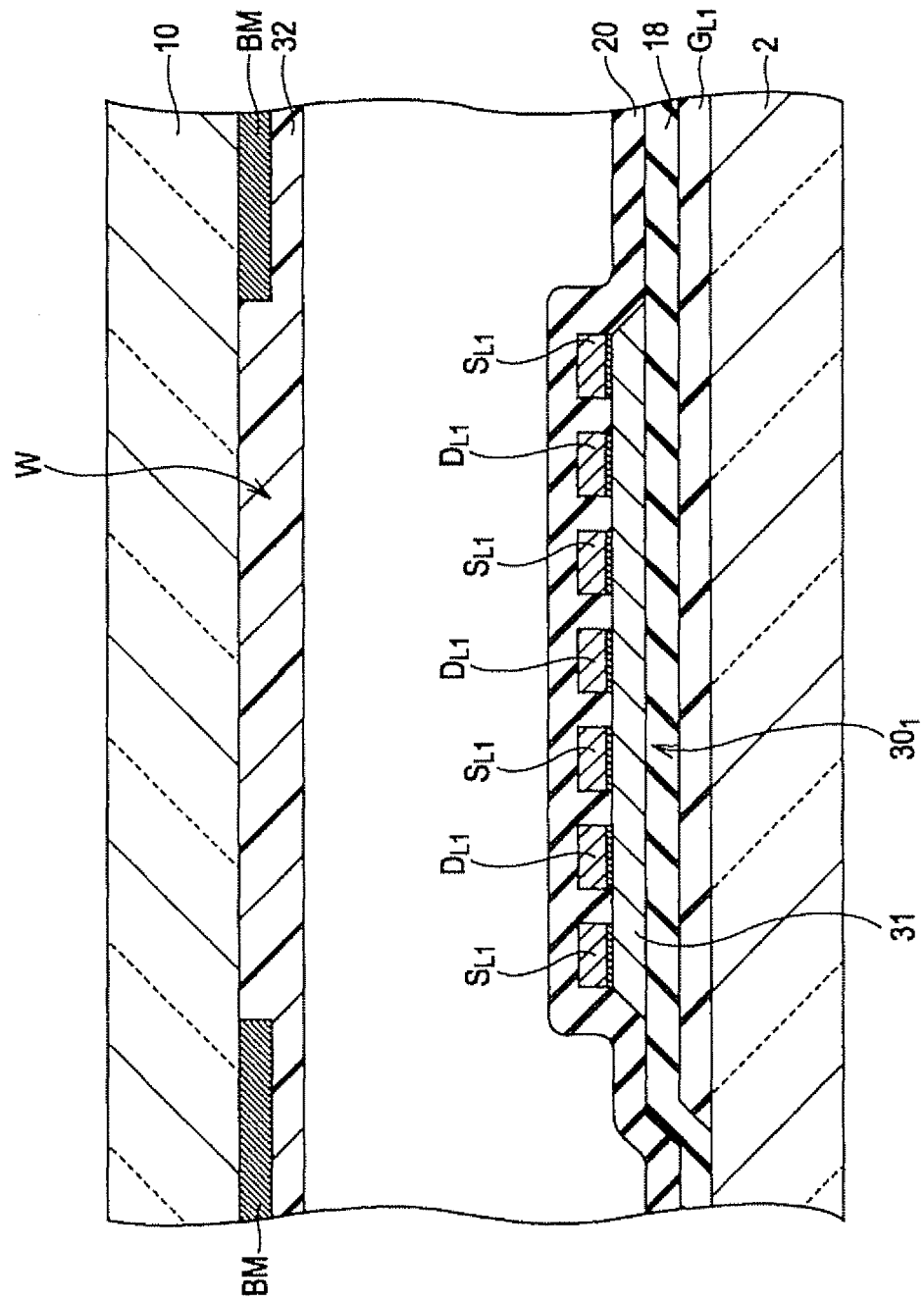
FIG. 6 is a cross-sectional view taken along line VI-VI of FIG. 4.
Figure 7:
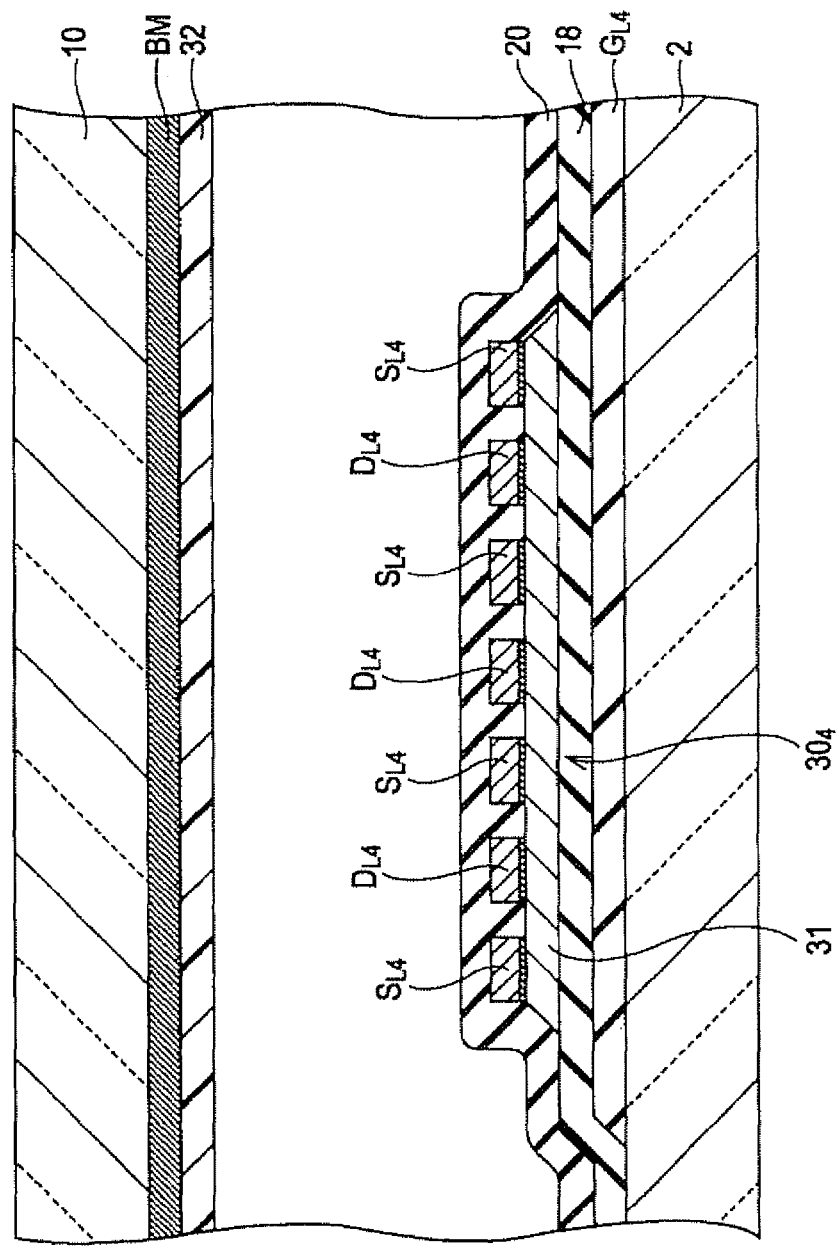
FIG. 7 is a cross-sectional view taken along line VII-VII of FIG. 4.

FIG. 1 is a schematic plan view showing an array substrate and perspectively showing a color filter substrate of a semi-transmissive type liquid crystal display device according to Embodiment 1. FIG. 2 is a plan view showing one pixel of the array substrate shown in FIG. 1. FIG. 3 is a cross-sectional view taken along line III-III of FIG. 2. FIG. 4 is an enlarged plan view showing a light detector. FIG. 5 is an equivalent circuit diagram of the light detector shown in FIG. 4. FIG. 6 is a cross-sectional view taken along line VI-VI of FIG. 4. FIG. 7 is a cross-sectional view taken along line VII-VII of FIG. 4.

As shown in FIG. 1 the liquid crystal display device 1A includes an array substrate AR in which various wires are formed on a rectangular transparent substrate 2 formed of a transparent insulating material, for example, a glass plate, and a color filter substrate CF in which various wires are formed on a rectangular transparent substrate 10 formed of a transparent insulating material, both of which face each other. The array substrate AR has a larger size than that of the color filter substrate CF such that an extension portion 2A having a predetermined space is formed when facing the color filter substrate CF, a seal material (not shown) is adhered to the array substrate AR and the color filter substrate CF, and liquid crystal 14 and spacers are filled therein.

The array substrate AR has short sides 2a and 2b facing each other and long sides 2c and 2d facing each other, one short side 2b becomes the extension portion 2A, a semiconductor chip Dr for a source driver and a gate driver is mounted on the extension portion 2A, and a light detector LD1 is provided on the other short side 2a. A backlight unit (not shown) is provided on the rear surface of the array substrate AR as an illumination unit. The backlight unit is controlled by an external control circuit (control unit) (not shown) on the basis of the output of the light detector LD1.

The array substrate, AR includes a plurality of gate wires GW arranged in a row direction (horizontal direction) of FIG. 1 at a predetermined gap and a plurality of source wires SW, insulated from the gate wires GW, arranged in a column direction (vertical direction) on an opposite surface, that is, a surface contacting the liquid crystal. The source wires SW and the gate wires GW are arranged in a matrix and TFTs (see FIG. 2), functioning as switching elements which are turned on by scan signals from the gate wires GW and pixel electrodes 26 (see FIG. 3) to which image signals from the source wires SW are supplied through the switching elements, are formed in areas surrounded by the gate wires GW and the source wires SW which cross each other.

The areas surrounded by the gate wires GW and the source wires SW configure pixels and an area in which the pixels are formed is a display area DA. In the switching elements, for example, thin-film transistors (TFTs) are used.

The gate wires GW and the source wires SW are extended to the outside of the display area DA, that is, a frame area, and are routed on an external peripheral area at the outside of the display area DA so as to be connected to the driver Dr composed of a semiconductor chip such as an LS1. On the array substrate AR, routing wires L1 to L4 from first and second TFT ambient light photo-sensors LS1 and LS2 of the light detector LD1 are arranged at one long side 2d so as to be connected to terminals T1 to T4 connected with the external control circuit. The terminals T1 to T4 are connected with the external control unit, a reference voltage and a gate voltage are supplied from the control circuit to the light detector LD1, and the output of the light detector LD1 is transmitted. The routing wire L1 configures a first source wire as a first wire connected to a detection circuit, the routing wire L2 configures a second source wire as a second wire connected to the detection circuit, the routing wire L3 configures a drain wire as a wire which is not connected to the detection circuit, and the routing wire L4 configures a gate wire.

Next, the detailed configuration of each pixel will be described with reference to FIGS. 2 and 3.

In the display area DA on the transparent substrate 2 of the array substrate AR, the gate wires GW are formed in parallel at the same gap and the gate electrodes G of the TFTs configuring the switching elements extend from the gate wires GW. Auxiliary capacitive lines 16 are formed in the central portion between the adjacent gate wires GW in parallel to the gate wires GW and auxiliary capacitive electrodes 17, having a width larger than that of the auxiliary capacitive lines 16, are formed in the auxiliary capacitive lines 16.

A gate insulating film 18 formed of a transparent insulating film such as silicon nitride or silicon oxide is laminated on the entire surface of the transparent substrate 2 so as to cover the gate wires GW, the auxiliary capacitive lines 16, the auxiliary capacitive electrodes 17 and the gate electrodes G. A semiconductor layer 19 formed of a-Si is formed on the gate electrodes G with the gate insulating film 18 interposed therebetween. The plurality of source wires SW are formed on the gate insulating film 18 so as to cross the gate wires GW, the source electrodes S of the TFT extend from the source wires SW so as to contact the semiconductor layer 19, and the drain electrodes D, formed of the same material as the source electrodes SW and the source electrodes S, are provided on the gate insulating film 18 so as to contact the semiconductor layer 19.

Here, the area surrounded by the gate wire GW and the source wire SW corresponds to one pixel. The TFTs which are the switching elements are configured by the gate electrodes G, the gate insulating film 18, the semiconductor layer 19, the source electrodes S and the drain electrodes D. The TFTs are formed in the pixels. In this case, auxiliary capacitors of the pixels are formed by the drain electrodes D and the auxiliary capacitive electrodes 17.

A protective insulating film (also called a passivation film) 20 formed of, for example, an inorganic insulating material, is laminated over the entire surface of the transparent substrate 2 so as to cover the source wires SW, the TFTs and the gate insulating film 18 and an interlayer film (also called a planarization film) 21 formed of acrylic resin including, for example, a negative photosensitive material is laminated on the protective insulating film 20 over the entire transparent substrate 2. The surface of the insulating film 21 has irregularities in a reflection portion 22 and is flat in a transmission portion 23. In FIGS. 2 and 3, the irregularities in the reflection portion 22 are not shown.

A reflection plate 24 made of, for example aluminum or an aluminum alloy is formed on the surface of the interlayer film 21 of the reflection portion 22 by a sputtering method and a contact hole 25 is formed in the protective insulating film 20, the interlayer film 21 and the reflection plate 24 at a position corresponding to the drain electrode D of the TFT.

In each pixel, a pixel electrode 26 formed of, for example, indium tin oxide (ITO) or indium zinc oxide (IZO) is formed on the surface of the reflection plate 24, inside of the contact hole 25 and the surface of the interlayer film 21 of the transmission portion 23 and an alignment film (not shown) is laminated on the pixel electrode 26 so as to cover all pixels.

In the color filter substrate CF, on the surface of the transparent substrate 10 made of a glass substrate, a light-shielding layer (not shown) is formed so as to face the gate wires GW and the source wires SW of the array substrate AR and a color filter layer 27 of red (R), green (G) and blue (B) is provided in correspondence with the pixels surrounded by the light-shielding layer. An overcoat layer 28 is formed on the surface of the color filter layer 27 at a position corresponding to the reflection portion 22 and a common electrode 29 and an alignment film (not shown) are laminated on the surface of the color filter layer 27 and the surface of the overcoat layer 28 at a position corresponding to the transmission portion 23. As the color filter layer 27, a color filter layer of cyan (C), magenta (M) and yellow (Y) may be used. In a monochromic display, the color filter layer may not be provided.

The array substrate AR and the color filter substrate CF having the above-described configurations are adhered via a seal material (not shown) and the liquid crystal 14 is filled in an area surrounded by the both substrates and the seal material, thereby obtaining the semi-transmissive type liquid crystal display device 1A. A backlight unit or a sidelight unit having a known light source, a light guiding plate, and a diffusion sheet (not shown) is provided below the transparent substrate 2.

In this case, if the reflection plate 24 is provided over the lower side of the pixel electrode 26, but, in a reflective type liquid crystal display device using a reflective type liquid crystal display panel, a front side unit is used instead of the backlight light or the sidelight unit.

Next, the configuration of the light detector LD1 will be described in detail with reference to FIGS. 1 and 4 to 7. Only six ambient light photo-sensors $30_1$ to $30_6$ are shown in FIGS. 4 and 6, but the number of ambient light photo-sensors $30_1$ to $30_6$ is not limited to 6 and may be properly modified in a range equal to or larger than 2.

As shown in FIGS. 1 and 4, the light detector LD1 is composed of a first TFT ambient light photo-sensor LS1 and a second TFT ambient light photo-sensor LS2. The first and second TFT ambient light photo-sensors LS1 and LS2 include a plurality (three in FIG. 4) of ambient light photo-sensors $30_1$ to $30_3$ and $30_4$ to $30_6$, respectively. The ambient light photo-sensors $30_1$ to $30_3$ configuring the first TFT ambient light photo-sensor LS1 and the ambient light photo-sensor $30_4$ to $30_6$ configuring the second TFT ambient light photo-sensor LS2 are provided in a line so as to be adjacent or parallel to each other.

In the circuit configuration of the plurality of ambient light photo-sensors $30_1$ to $30_6$ configuring the first and second TFT ambient light photo-sensors LS1 and LS2, as shown in FIG. 5, capacitors $C_1$ to $C_6$ are connected to the drain electrodes $D_{L1}$ to $D_{L6}$ and the source electrode $S_{L1}$ to $S_{L6}$ in parallel, one terminal of the capacitors $C_1$ to $C_6$ and the source electrodes $S_{L1}$ to $S_{L6}$ are connected to terminals T1 and T2 via routed wires L1 and L2, and the terminals T1 and T2 are connected to a first reference voltage source Vs (for example, +2V) via switching elements SW1 and SW2. In addition, the other terminal of the capacitors $C_1$ to $C_6$ and the drain electrodes $D_{L1}$ to $D_{L6}$ of the ambient light photo-sensors $30_1$ to $30_6$ are connected to a terminal T3 via a single routed wire L3 and the terminal T3 is connected to a second voltage source Vref for supplying a predetermined DC voltage. In addition, the terminals T1 and T2 are connected output lines and the output lines output predetermined voltages $S_S$ and $S_R$. In addition, the gate electrodes $G_{L1}$ to $G_{L6}$ of the ambient light photo-sensors $30_1$ to $30_6$ are connected to a terminal T4 via a routed wire L4 and the terminal T4 is connected to a predetermined voltage supplying source GV (for example, −10V). Although the terminal T3 is connected to the second reference voltage source Vref, the invention is not limited thereto. In addition, as shown in FIG. 5, although, in Embodiment 1, the capacitors $C_1$ to $C_6$ are respectively provided in the ambient light photo-sensors $30_1$ to $30_6$, the invention is not limited thereto. For example, capacitors having a relatively large capacitance may be provided in the first and second TFT ambient light photo-sensors LS1 and LS2, respectively.

The detected output voltage is used for detecting the intensity of the environment light by a detection circuit (not shown) and the backlight unit is controlled by a control unit (not shown) on the basis of the detected intensity of the environment light. In the detection circuit, the output voltage is converted into an analog output voltage by a known sampling hold circuit synchronized with ON/OFF of the switching elements SW1 and SW2, and the analog output voltage is converted into a digital voltage by an A/D converter and is subjected to a digital operation.

Next, among the ambient light photo-sensors $30_1$ to $30_6$ configuring the first and second TFT ambient light photo-sensors LS1 and LS2, the wire structures of one ambient light photo-sensor $30_1$ configuring the first TFT ambient light photo-sensor and one ambient light photo-sensor $30_4$ configuring the second TFT ambient light photo-sensor will be described.

First, in the ambient light photo-sensor $30_1$ configuring the first TFT ambient light photo-sensor LS1, as shown in FIGS. 4 and 6, the gate electrode $G_{L1}$ is first formed and the gate insulating film 18 made of a transparent insulating material is formed so as to cover the gate electrode $G_{L1}$. Subsequently, a semiconductor layer 31 which is made of amorphous silicon or polycrystalline silicon and becomes a light-receiving portion of the environment light is formed over the gate insulating film 18. Then, on the semiconductor layer 31, the plurality of source electrodes $S_{L1}$ are formed so as to cross the semiconductor layer 31 from one side of the semiconductor layer 31 and more particularly the side opposite to the side of the first TFT ambient light photo-sensor LS1 adjacent to the second TFT ambient light photo-sensor LS2. At the same time, the plurality of drain electrodes $D_{L1}$ are formed so as to form the semiconductor layer 31 from the other side of the semiconductor 31 and more particularly the side of the first TFT ambient light photo-sensor LS1 adjacent to the second TFT ambient light photo-sensor LS2. Since the plurality of source electrodes $S_{L1}$ are formed so as to extend from the routed wire L1 routed to the outside of the first TFT ambient light photo-sensor LS1, the source electrodes $S_{L1}$ have a comblike shape in a plan view. Similarly, the plurality of drain electrodes $D_{L1}$ are formed so as to extend from the routed wire L3 routed to the inside of the first TFT ambient light photo-sensor LS1 and have a comblike shape in a plan view similar to the source electrodes $S_{L1}$. The protective insulating film 20 is formed on upper layer of the source electrodes $S_{L1}$ and the drain electrodes $D_{D1}$.

The environment light is irradiated on the ambient light photo-sensor $30_1$ via a window portion W in which the overcoat layer (planarization film) 32 made of transparent resin in the opposite area of the color filter substrate CF. The periphery of the window portion W is shield by the light-shielding layer BM. By shielding the periphery of the window portion W by the light-shielding layer BM, it is possible to more accurately receive the environment light without irradiating the light from the periphery onto the semiconductor layer 31.

In the ambient light photo-sensor $30_4$ configuring the second TFT ambient light photo-sensor LS2, as shown in FIGS. 4 and 7, the gate electrode $G_{L4}$ is first formed and the gate insulating film 18 made of a transparent insulating material is formed so as to cover the gate electrode $G_{L4}$. Subsequently, the semiconductor layer 31 which is made of amorphous silicon or polycrystalline silicon and becomes a fight-receiving portion of the environment light is formed on the gate insulating film 18. Then, on the semiconductor layer 31, the plurality of source electrodes $S_{L4}$ are formed so as to cross the semiconductor layer 31 from one side of the semiconductor layer 31 and more particularly the side opposite to the side of the second TFT ambient light photo-sensor LS2 adjacent to the first TFT ambient light photo-sensor LS1. At the same time, the plurality of drain electrodes $D_{L4}$ are formed so as to form the semiconductor layer 31 from the other side of the semiconductor 31 and more particularly the side of the second TFT ambient light photo-sensor LS2 adjacent to the first TFT ambient light photo-sensor LS1. Since the plurality of source electrodes $S_{L4}$ are formed so as to extend from the routed wire L2 routed to the outside of the second TFT ambient light photo-sensor LS2, the source electrodes $S_{L4}$ have a comblike shape in a plan view. Similarly, the plurality of drain electrodes $D_{L4}$ are formed so as to extend from the routed wire L3 routed to the inside of the second TFT ambient light photo-sensor LS2 and have a comblike shape in a plan view similar to the source electrodes $S_{L4}$. The protective insulating film 20 is formed on the source electrodes $S_{L4}$ and the drain electrodes $D_{L4}$.

The ambient light photo-sensor $30_4$ is shielded by the light-shielding layer IBM formed in the area facing the color filter substrate CF. Accordingly, the ambient light photo-sensor $30_4$ hardly receives the environment light and thus the output of the ambient light photo-sensor $30_4$ is used as a dark reference voltage. In addition, as described above, the drain electrode $D_{L4}$ of the second TFT ambient light photo-sensor LS2 and the drain electrode $D_{L1}$ of the first TFT ambient light photo-sensor LS1 are connected to the terminal T4 by the single routed wire L3. However, since the voltage supplied via the routed wire L3 is the voltage from the second reference voltage source Vref, the first and second TFT ambient light photo-sensors LS1 and LS2 can be normally operated.

In the light detector LD1 having the above-described configuration, a predetermined reverse bias voltage (for example, −10V) which becomes a gate off area is applied from the voltage supply source GV to the gate electrodes $G_{L1}$ to $G_{L6}$ of the ambient light photo-sensors $30_1$ to $30_6$ of the first and second TFT ambient light photo-sensors LS1 and LS2 via the terminal T4 and the routed wire L4 and the capacitors $C_1$ to $C_6$ are connected between the drain electrodes $D_{L1}$ to $D_{L6}$ and the source electrodes $S_{L1}$ to $S_{L6}$. The first reference voltage source Vs is connected to one end of the drain electrodes $D_{L1}$ to $D_{L6}$ and the capacitors $C_1$ to $C_6$ via the switching elements SW1 and SW2, and any one of the switching elements SW1 and SW2 is turned on so as to apply a predetermined voltage (for example, +2V) across the capacitors $C_1$ to $C_3$ or $C_4$ to $C_6$ and the switching element SW1 or SW2 is turned off. After the elapse of time, the charging voltage of the capacitors $C_1$ to $C_3$ or $C_4$ to $C_6$ is output to the output line and is supplied to the detection circuit, thereby detecting the intensity of the environment light.

As described above, according to the semi-transmissive type liquid crystal display device 1A according to Embodiment 1, when the light detector having ambient light photo-sensors of two systems is formed, wires are at least one fewer than those of the related art. The gate wires GW are routed in the frame area of the array substrate AR, and thus the area of the long side 2d in which the wires are formed with high density can be suppressed to small area. Thus, it is possible to provide a liquid crystal display device suitable for the requirement for a narrow frame.

Embodiment 2

Although, in the semi-transmissive type liquid crystal display device 1A according to Embodiment 1, the light detector LD1 is formed by the first and second TFT ambient light photo-sensors LS1 and LS2 arranged in two lines, the first and second TFT ambient light photo-sensors LS1 and LS2 may be arranged in a line. Hereinafter, a semi-transmissive type liquid crystal display device 1B having a light detector LD2 in which the first and second TFT ambient light photo-sensors LS1 and LS2 are arranged in a line will be described as Embodiment 2

Figure 8:
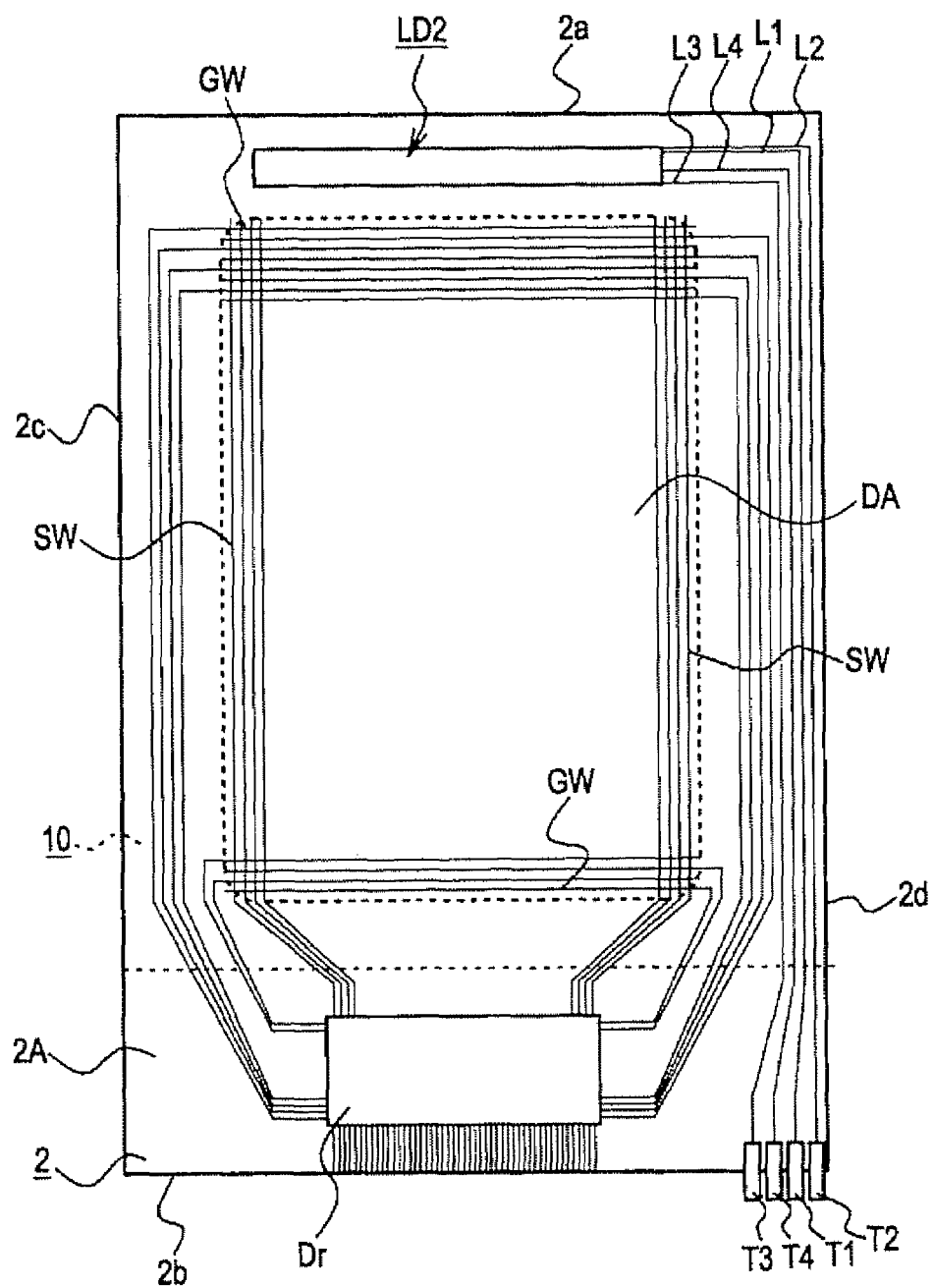
FIG. 8 is a schematic plan view showing an array substrate and perspectively showing a color filter substrate of a semi-transmissive type liquid crystal display device according to Embodiment 2.
Figure 9:
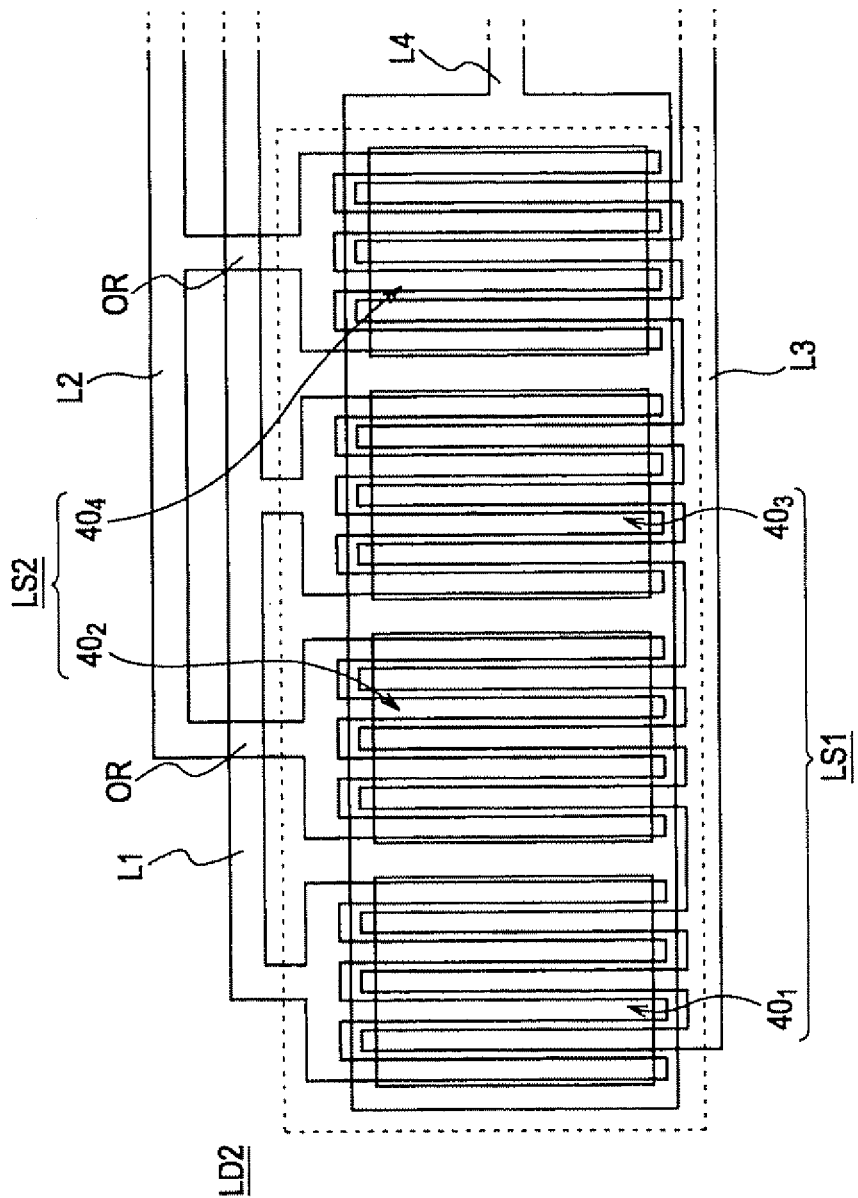
FIG. 9 is an enlarged plan view of a light detector of Embodiment 2.

FIG. 8 is a schematic plan view showing an array substrate and perspectively showing a color filter substrate of a semi-transmissive type liquid crystal display device according to Embodiment 2. FIG. 9 is an enlarged plan view of a light detector of Embodiment 2. The light detector LD2 of Embodiment 2 is similar to Embodiment 1 except for the arrangement structure of the ambient light photo-sensors $40_1$ to $40_4$ and the routed wires L1 to L3 and thus the same components are denoted by the same reference numerals as Embodiment 1.

In the light detector LD2 of the semi-transmissive type liquid crystal display device 1B of Embodiment 2, as shown in FIGS. 8 and 9, a plurality of ambient light photo-sensors $40_1$ to $40_4$ are arranged in a line. Among the ambient light photo-sensors $40_1$ to $40_4$, the ambient light photo-sensors $40_1$ and $40_3$ configure the first TFT ambient light photo-sensor LS1 and the ambient light photo-sensors $40_2$ and $40_4$ configure the second TFT ambient light photo-sensor LS2. That is, the ambient light photo-sensors $40_1$ and $40_3$ of the first TFT ambient light photo-sensor LS1 and the ambient light photo-sensors $40_2$ and $40_4$ of the second TFT ambient light photo-sensor LS2 are alternately arranged in the same straight line.

The ambient light photo-sensors $40_1$ and $40_3$ of the first TFT ambient light photo-sensor LS1 has the same structure as the structure shown in FIG. 6 of Embodiment 1 and has the source electrodes $S_{L1}$ and $S_{L4}$ connected to the routed wire L1 arranged along one side of the light detector LD2. The ambient light photo-sensors $40_2$ and $40_4$ of the second TFT ambient light photo-sensor LS2 has the same structure as the structure shown in FIG. 7 of Embodiment 1 and has the source electrodes $S_{L2}$ and $S_{L4}$ connected to the routed wire L2 arranged along one side of the light detector LD2. The routed wires L1 and L2 connected to the source electrodes $S_{L1}$ to $S_{L4}$ are provided in parallel and the routed wires L1 and L2 are branched so as to be connected to the source electrodes $S_{L1}$ to $S_{L4}$ of the ambient light photo-sensors $40_1$ to $40_4$.

In addition, the ambient light photo-sensors $40_1$ to $40_4$ have drain electrodes $D_{L1}$ to $D_{L4}$ connected to the routed wire L3 arranged along the other side of the light detector LD2, that is, the side opposite to the side in which the routed wires L1 and L2 connected to the source electrodes $S_{L1}$ to $S_{L4}$. That is, even in the semi-transmissive-type liquid crystal display device 1B of Embodiment 2, the number of routed wires connected to the drain electrodes $D_{L1}$ to $D_{L4}$ is one.

In Embodiment 2, although the light detector LD2 is formed by arranging the plurality of ambient light photo-sensors $40_1$ to $40_4$ in a line, the wires are at least one fewer than those of the related art. Accordingly, the width of the frame area of the short side 2a of the array substrate AR can be reduced. If the ambient light photo-sensors of the same number as Embodiment 1 are used, the ambient light photo-sensors can be arranged in a wider range than that of Embodiment 1. Thus, although the environment light is partially shielded by an obstacle, it is possible to maintain stable detection.

Embodiment 3

While the frame area is reduced by arranging the ambient light photo-sensors $40_1$ to $40_4$ in a line in Embodiment 2, an area (an OR portion of FIG. 9) in which the wires L1 and L2 connected to the source electrodes $S_{L1}$ to $S_{L4}$ overlap each other occurs by the above wire structure. The overlapping area OR needs to have a bridge structure for insulation with the routed wires L1 and L2. Since capacitance may occur in the overlapping area OR, detection environments of the ambient light photo-sensors may be slightly different from one another. Accordingly, in Embodiment 3, a semi-transmissive type liquid crystal display device 1C having a light detector $L_{D3}$ in which a plurality of ambient light photo-sensors $50_1$ to $50_4$ are arranged in a line without the overlapping area OR will be described as a modified example of the semi-transmissive type liquid crystal display device 1B of Embodiment 2.

Figure 10:
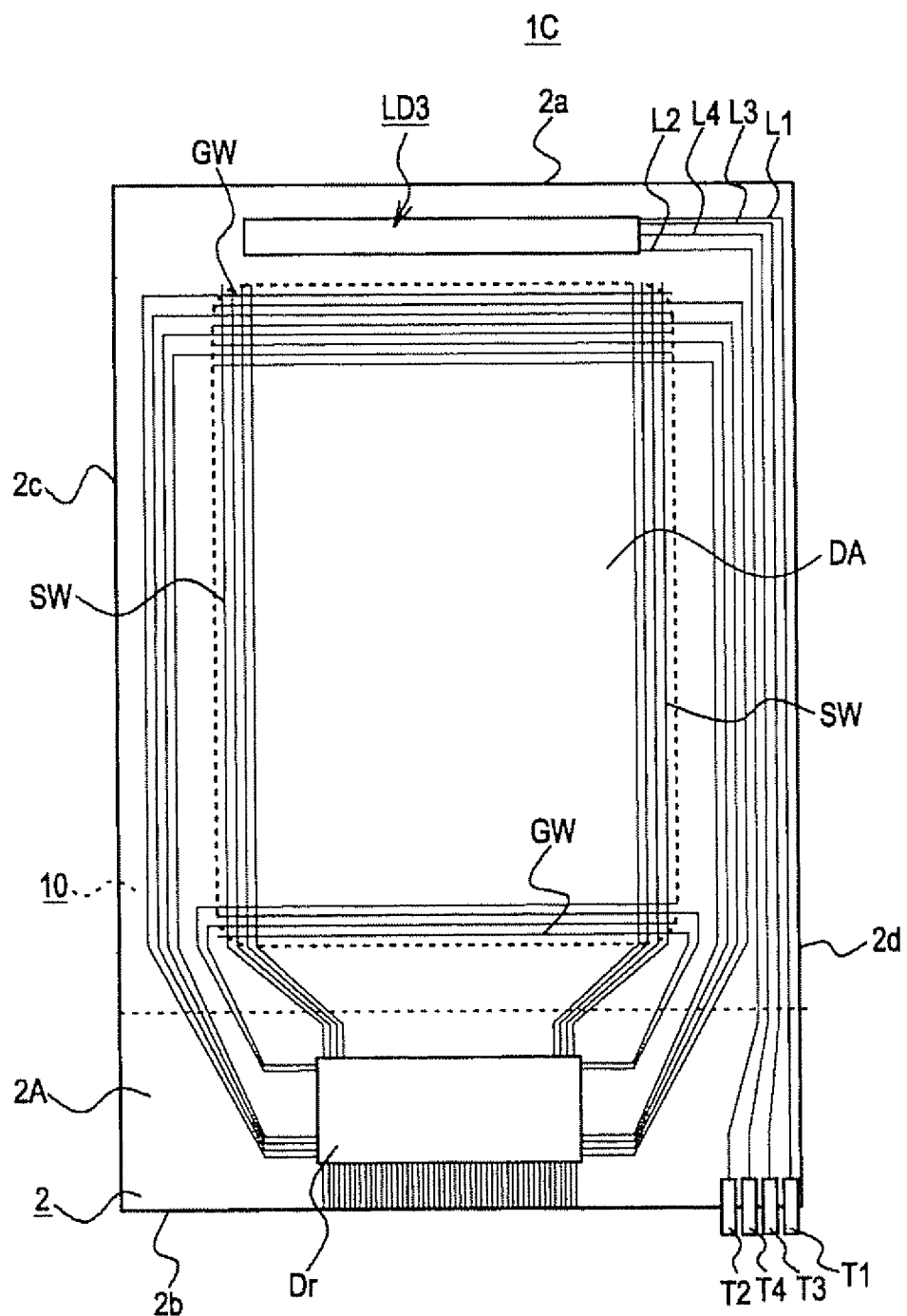
FIG. 10 is a schematic plan view showing an array substrate and perspectively showing a color filter substrate of a semi-transmissive type liquid crystal display device according to Embodiment 3.
Figure 11:
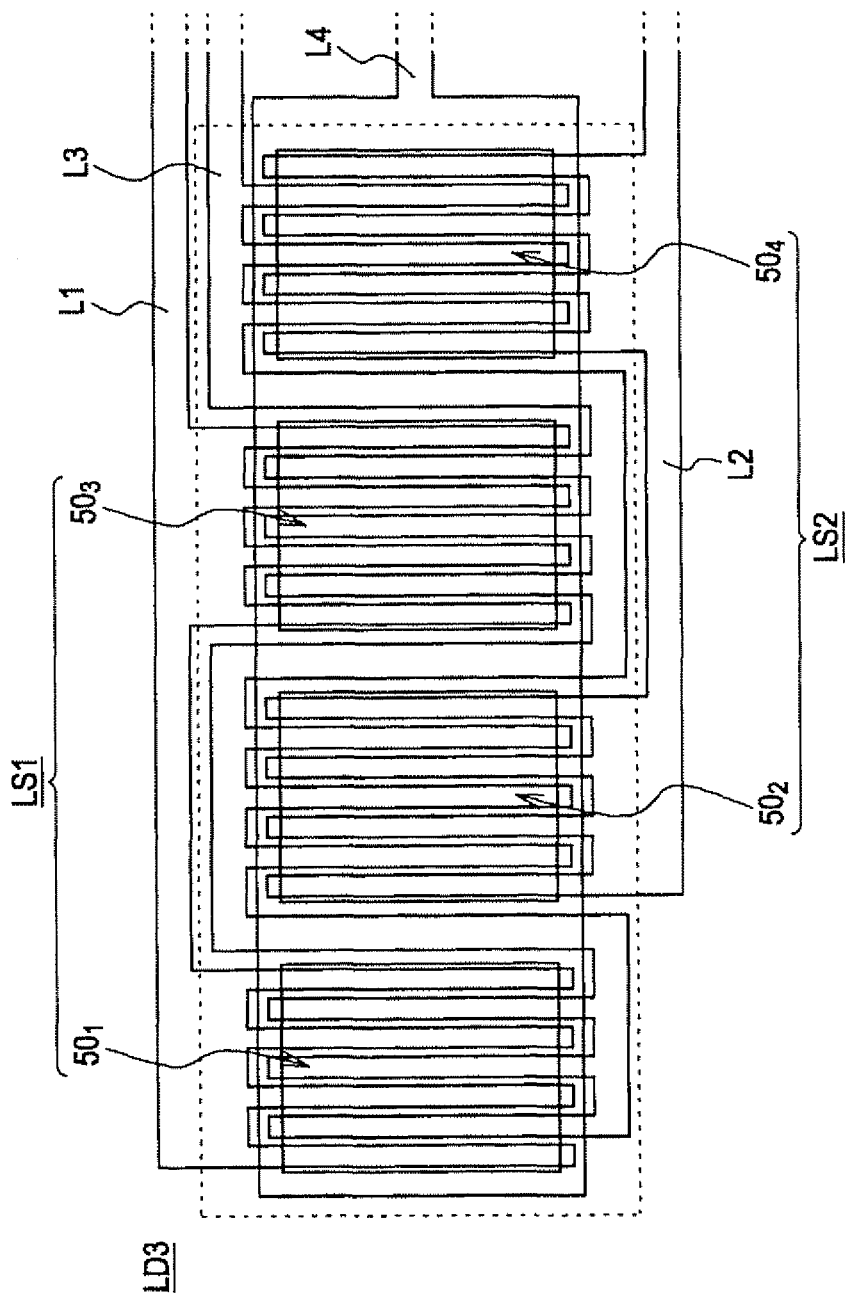
FIG. 11 is an enlarged plan view of a light detector of Embodiment 3.

FIG. 10 is a schematic plan view showing an array substrate and perspectively showing a color filter substrate of a semi-transmissive type liquid crystal display device according to Embodiment 3. FIG. 11 is an enlarged plan view of a light detector of Embodiment 3. The light detector $L_{D3}$ of Embodiment 3 is similar to Embodiment 1 except for the arrangement structure of the ambient light photo-sensors $50_1$ to $50_4$ and the routed wires L1 to L3 and thus the same components are denoted by the same reference numerals as Embodiment 1.

In the light detector LD3 of the semi-transmissive type liquid crystal display device 1C of Embodiment 3, as shown in FIGS. 10 and 11, a plurality of ambient light photo-sensors $50_1$ to $50_4$ are arranged in a line. Among the ambient light photo-sensors $50_1$ to $50_4$, the ambient light photo-sensors $50_1$ and $50_3$ configure the first TFT ambient light photo-sensor LS1 and the ambient light photo-sensors $50_2$ and $50_4$ configure the second TFT ambient light photo-sensor LS2. That is, the ambient light photo-sensors $50_1$ and $50_3$ of the first TFT ambient light photo-sensor LS1 and the ambient light photo-sensors $50_2$ and $50_4$ of the second TFT ambient light photo-sensor LS2 are alternately arranged in the same straight line.

The ambient light photo-sensors $50_1$ and $50_3$ of the first TFT ambient light photo-sensor LS1 has the same structure as the structure shown in FIG. 6 of Embodiment 1 and has the source electrodes $S_{L1}$ and $S_{L3}$ connected to the routed wire L1 arranged along one side of the light detector $L_{D3}$. The ambient light photo-sensors $50_2$ and $50_4$ of the second TFT ambient light photo-sensor LS2 has the same structure as the structure shown in FIG. 7 of Embodiment 1 and has the source electrodes $S_{L2}$ and $S_{L4}$ connected to the routed wire L2 arranged along the other side of the light detector $L_{D3}$, that is, the side opposite to the side in which the routed wire L1 connected to the source electrodes $S_{L1}$ and $S_{L3}$ is formed.

In the light sources $50_1$ to $50_4$, a gap is formed between adjacent ambient light photo-sensors and drain electrodes $D_{L1}$ to $D_{L4}$ are connected to the routed wire L3 arranged in a snaking state along the gap. If the routed wire L3 connected to the drain electrodes $D_{L1}$ to $D_{L4}$ is formed in a snaking state along the gap of the light sources $50_1$ to $50_4$, the overlapping portion does not occur between the routed wires L1 to L3. Even in the semi-transmissive type liquid crystal display device 1C of Embodiment 3, the number of routed wires connected to $D_{L1}$ to $D_{L4}$ is one.

As described above, in Embodiment 3, although the light detector $L_{D3}$ is formed by arranging the plurality of ambient light photo-sensors $50_1$ to $50_4$ in a line, the wires are at least one fewer than those of the related art and the overlapping portion does not occur between the routed wires L1 to L3. Accordingly, the ambient light photo-sensors $50_1$ to $50_4$ can be operated under the same condition. Thus, the width of the frame area of the short side $2a$ of the array substrate AR can be reduced and the environment light can be accurately detected.

Although, in the semi-transmissive type liquid crystal display devices 1A to 1C of Embodiments 1 to 3, the drain electrodes $D_{L1}$ to $D_{L6}$ ($D_{L4}$) are connected to the second reference voltage source Vref and the source electrodes $S_{L1}$ to $S_{L6}$ ($S_{L4}$) are connected to the output line and the first reference voltage source Vs, the terms "drain electrodes" and the "source electrodes" described herein are only used for description and the source electrodes $S_{L1}$ to $S_{L6}$ ($S_{L4}$) may be connected to the second reference voltage source Vref and the drain electrodes $D_{L1}$ to $D_{L6}$ ($D_{L4}$) may be connected to the output line and the first reference voltage source Vs.

Although, in Embodiments 1 to 3, the first TFT ambient light photo-sensor LS1 directly receives the environment light, the second TFT ambient light photo-sensor LS2 is shielded by the light-shielding layer BM so as to output the dark reference voltage as the first and second TFT ambient light photo-sensors LS1 and LS2 of two different systems, the invention is not limited thereto. In more detail, if for example, a structure in which a color filter layer is formed in the window portion W as the first TFT ambient light photo-sensor LS1 is employed, it is possible to detect the environment light with spectral sensitivity in a luminosity factor.

Since the ambient light photo-sensors $30_1$ to $30_6$, $40_1$ to $40_4$ and $50_1$ to $50_4$ of the light detectors LD1 to LD3 of Embodiments 1 to 3 are formed by the same TFT as the TFT formed as the switching element in the display area DA, the ambient light photo-sensors can be simultaneously formed with the TFT as the switching element and a separate manufacturing process does not need to be added.

Figure 12A:
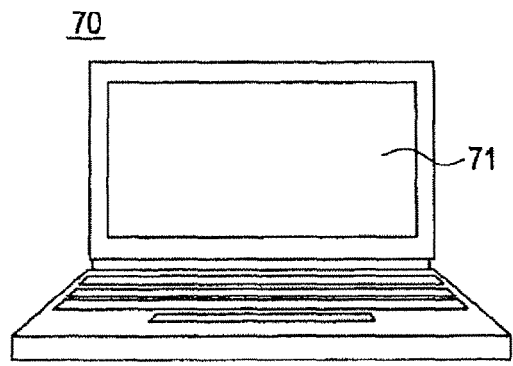
FIG. 12A is a view showing a personal computer including a liquid crystal display device mounted thereon.
Figure 12B:
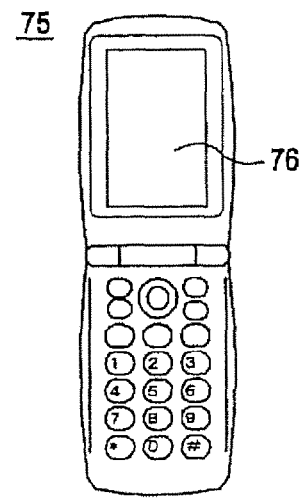
FIG. 12B is a view showing a mobile telephone including a liquid crystal display device mounted thereon.
Figure 13:
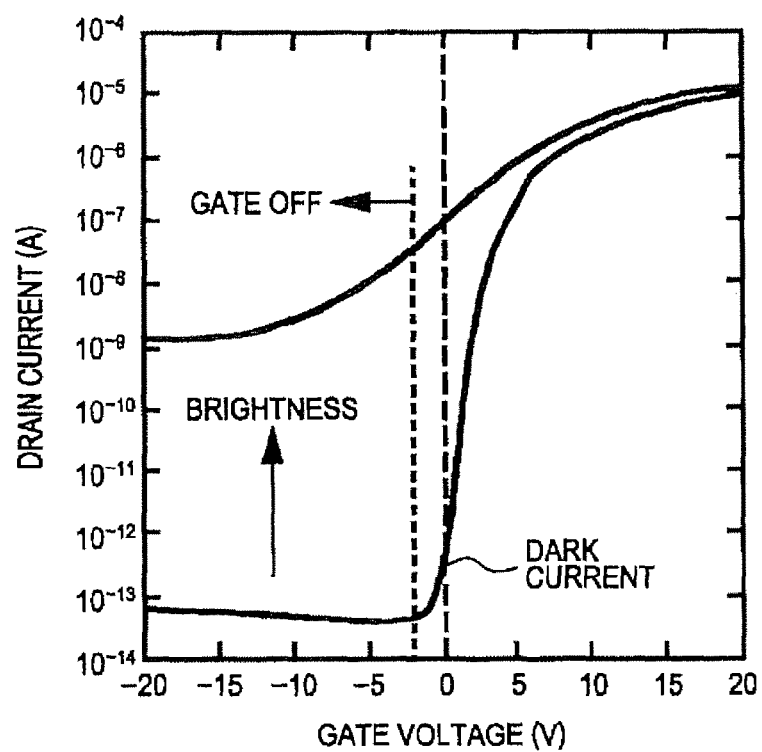
FIG. 13 is a view showing an example of a voltage-current curve of a TFT ambient light photo-sensor.
Figure 14:
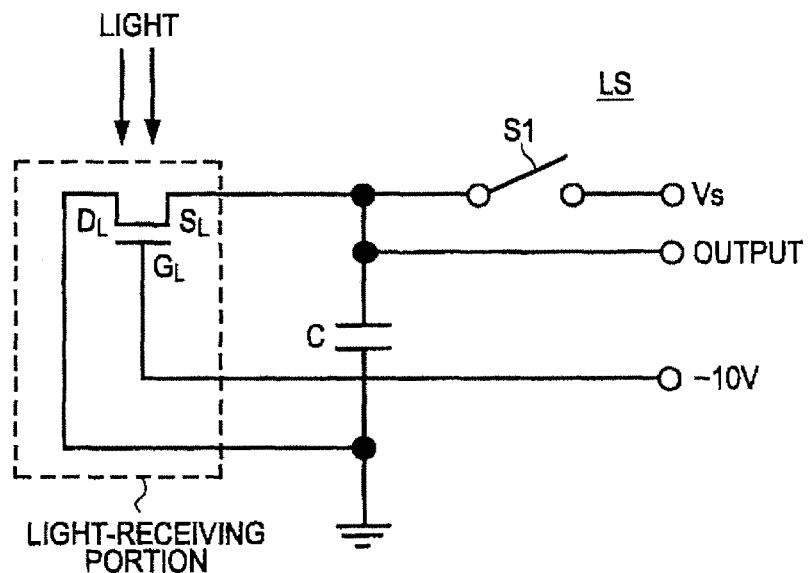
FIG. 14 is a circuit diagram of the TFT ambient light photo-sensor.
Figure 15:
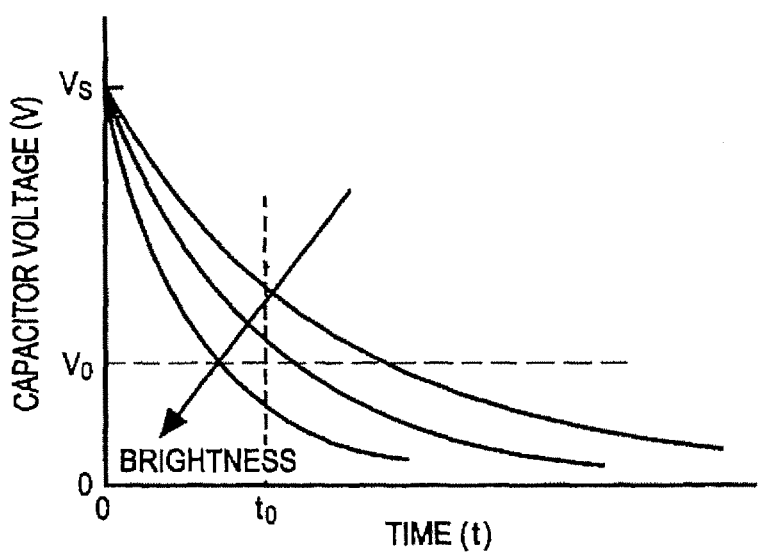

FIG. 12A is a view showing a personal computer 70 including a liquid crystal display device 71 mounted thereon FIG. 12B is a view showing a mobile telephone 75 including a liquid crystal display device 76 mounted thereon. The basic configurations of the personal computer 70 and the mobile telephone 75 are known to those skilled in the art and thus the detailed description thereof will be omitted.

What is claimed is:
1. A liquid crystal display device comprising:
a liquid crystal display panel;
a light detector which is mounted on the liquid crystal display panel and has a plurality of thin-film transistor (TFT) ambient light photo-sensors composed of thin-film transistors (TFTs) that detect external light;
an illumination unit which illuminates light on the liquid crystal display panel;
a detection circuit connected to the light detector; and
a control unit which controls the brightness of the illumination unit on the basis of the output of the detection circuit,
wherein the plurality of TFT ambient light photo-sensors include first and second TFT ambient light photo-sensors for detecting light of different systems, the first and second TFT ambient light photo-sensors being alternately arranged on the same row,
wherein first wires, among source wires or drain wires of the first and second TFT ambient light photo-sensors that are connected to the detection circuit, are routed to the outside of the first and second TFT ambient light photo-sensors, one of the first wires being routed to an outer side of the first TFT ambient light photo-sensor and another of the first wires being routed to an outer side of the second TFT ambient light photo-sensor that is opposed to the outer side of the first TFT ambient light photo-sensor,
wherein second wires, among source wires or drain wires of the first and second TFT ambient light photo-sensors that are not connected to the detection circuit, form a single common wire that is routed between the first and second TFT ambient light photo-sensors in a snaking pattern between the patterns of the first wires and without intersecting or overlapping any portion of the first wires, and wherein the first wires that are connected to the detection circuit are arranged in parallel with the single common wire.

2. The liquid crystal display device according to claim 1, at least one of the first and second TFT ambient light photo-sensors being covered with a light-shielding layer or a color filter layer of predetermined colors.

3. A method of manufacturing the liquid crystal display device according to claim 1, the method comprising:

simultaneously forming the plurality of TFT ambient light photo-sensors with a TFT, the TFT being formed as a switching element.

4. An electronic apparatus comprising the liquid crystal display device according to claim 1.

5. A light detector comprising:

a plurality of thin-film transistor (TFT) ambient light photo-sensors including:

first and second TFT ambient light photo-sensors to detect light of different systems, the first and second TFT ambient light photo-sensors being alternately arranged on the same row, wherein first wires, among source wires or drain wires of the first and second TFT ambient light photo-sensors that are connected to a detection circuit, are routed to the outside of the first and second TFT ambient light photo-sensors, one of the first wires being routed to an outer side of the first TFT ambient light photo-sensor and another of the first wires being routed to an outer side of the second TFT ambient light photo-sensor that is opposed to the outer side of the first TFT ambient light photo-sensor, wherein second wires, among source wires or drain wires of the first and second TFT ambient light photo-sensors that are not connected to the detection circuit, form a single common wire that is routed between the first and second TFT ambient light photo-sensors in a snaking pattern between the patterns of the first wires and without intersecting or overlapping any portion of the first wires, and wherein the first wires that are connected to the detection circuit are arranged in parallel with the single common wire.

6. The light detector according to claim 5, at least one of the first and second TFT ambient light photo-sensors being covered with a light-shielding layer or a color filter layer of predetermined colors.

7. An electronic apparatus comprising the light detector according to claim 5.

* * * * *